United States Patent [19]
MacLeod et al.

[11] Patent Number: 6,100,824
[45] Date of Patent: Aug. 8, 2000

[54] SYSTEM AND METHOD FOR DATA COMPRESSION

[75] Inventors: John B. MacLeod, Del Mar; Julius E. Okopi; Robert J. Millar, both of San Diego, all of Calif.

[73] Assignee: National Dispatch Center, Inc., San Diego, Calif.

[21] Appl. No.: 09/055,260

[22] Filed: Apr. 6, 1998

[51] Int. Cl.[7] .................................................. H03M 7/30
[52] U.S. Cl. ................................ 341/51; 341/67; 341/106
[58] Field of Search ................................ 341/51, 87, 106, 341/67

[56] References Cited

U.S. PATENT DOCUMENTS

| | | |
|---|---|---|
| 4,263,480 | 4/1981 | Levine . |
| 4,330,780 | 5/1982 | Masaki . |
| 4,336,524 | 6/1982 | Levine . |
| 4,382,256 | 5/1983 | Nagata . |
| 4,471,352 | 9/1984 | Soulliard et al. . |
| 4,618,860 | 10/1986 | Mori . |
| 4,713,808 | 12/1987 | Gaskill et al. . |
| 4,870,402 | 9/1989 | DeLuca et al. . |
| 4,994,797 | 2/1991 | Breeden . |
| 5,159,331 | 10/1992 | Park et al. . |
| 5,187,470 | 2/1993 | King et al. . |
| 5,223,831 | 6/1993 | Kung et al. . |
| 5,257,307 | 10/1993 | Ise . |
| 5,258,739 | 11/1993 | DeLuca et al. . |
| 5,337,044 | 8/1994 | Folger et al. . |
| 5,396,228 | 3/1995 | Garahi . |
| 5,426,426 | 6/1995 | Hymel . |
| 5,532,694 | 7/1996 | Mayers et al. .......................... 341/67 |
| 5,561,702 | 10/1996 | Lipp et al. . |
| 5,566,001 | 10/1996 | Saidi et al. . |
| 5,574,439 | 11/1996 | Miyashita . |
| 5,594,435 | 1/1997 | Remillard . |
| 5,630,207 | 5/1997 | Gitlin et al. . |
| 5,635,918 | 6/1997 | Tett . |
| 5,635,932 | 6/1997 | Shinagawa et al. . |
| 5,652,572 | 7/1997 | Kido et al. . |
| 5,680,601 | 10/1997 | Rust . |
| 5,682,148 | 10/1997 | Gaskill et al. . |
| 5,870,036 | 2/1999 | Franasek et al. ......................... 341/51 |
| 5,951,623 | 9/1999 | Reynard et al. ......................... 341/51 |

OTHER PUBLICATIONS

Storer, Data Compression Method and Theory, ©1988 Computer Science Press, pp. 69–74.

*Primary Examiner*—Howard L. Williams
*Attorney, Agent, or Firm*—McDermott, Will & Emery

[57] ABSTRACT

A data compression system and a method for compressing an alphanumeric message is disclosed in which a predetermined dictionary has entries represented by corresponding phrase codes, a phrase encoder encodes strings of at least one symbol in the alphanumeric message with phrase codes representing dictionary entries corresponding to the strings, and a statistical model encoder encodes at least a portion of the remaining symbols in the message using a statistical model based coding method.

21 Claims, 13 Drawing Sheets

SYSTEM AND METHOD FOR DATA COMPRESSION

FIELD OF THE INVENTION

The present invention relates generally to a system and method for data compression suitable for use in, for example, data communications and data storage systems.

BACKGROUND

Data compression systems convert a stream of symbols forming an input message into an encoded stream of symbols forming an output message, from which the input message can be reconstructed. Successful compression results in an encoded output stream that is shorter than the original input stream.

One type of data compression technique is known as statistical modeling, which generally encodes individual symbols of an alphabet based on their statistical probabilities of appearance in a message. In general, statistical modeling methods represent symbols having higher probabilities of appearance with fewer bits than those symbols having lower probabilities of appearance. FIG. 1A is a block diagram illustrating a typical statistical modeling method: a statistical model 120 is used to determine probabilities for the symbols of the original stream 110 of a message. A model encoder 130 uses the determined probabilities from the model 120 in conjunction with the symbols from the original message stream 110 to determine codes for the symbols which are used to produce an encoded message stream 140.

FIG. 1B is a block diagram illustrating the decoding of the encoded message stream 140. As shown, the model decoder 160 decodes the encoded message stream 140 using a statistical model 150 corresponding to the encoding statistical model 120, producing symbols used to create a reconstructed message stream 170.

Statistical modeling methods may be static or adaptive. Static methods, such as those illustrated by FIGS. 1A and 1B, use fixed statistical models 120 and 150 to provide probabilities for the symbols, whereas adaptive models dynamically update statistical models to reflect changes in the probabilities of the symbols as more messages are processed. FIG. 2A illustrates an example of an adaptive statistical modeling method. Specifically, after symbols are encoded, the statistical model 220 is updated to reflect a recalculated probability of occurrence for the symbols. FIG. 2B illustrates a corresponding decoding system. Assuming that the encoding and decoding systems start with an identical initial model and that symbols (or their corresponding codes) are processed in the same order by the encoding and decoding systems, models 220 and 250 can be updated in sync so no additional data need be transmitted to ensure consistency between the models 220 and 250 used by the encoding and decoding systems.

Alternatively, as illustrated by FIGS. 2C and 2D, adaptive systems can be implemented to lessen the processing and memory resources required for decoding encoded message streams. The encoder 230A can be implemented such that when encoding a symbol using updated data from the model 220 for the first time, the model update information is transmitted along with the encoded symbol in the encoded message stream 240A. When received by the decoder 260A, the model update information is used to update the statistical model 250 so that the updated model can be used to decode the encoded message stream 240A to properly determine the symbols forming the reconstructed message stream 270.

Another type of data compression technique is dictionary-based compression. In contrast to the statistical model-based methods which use codes for individual symbols of an original message stream, dictionary-based methods use codes for strings of symbols in the original message stream. Typically, a dictionary-based compression method maintains a table of recognized strings. Strings in the original message stream that match string entries stored in the dictionary are encoded using a code representing the corresponding dictionary entries.

Examples of dictionary-based compression methods include the Ziv-Lempel ("LZ") family of data compression techniques first developed by Jacob Ziv and Abraham Lempel. See, e.g., Jacob Ziv & Abraham Lempel, *A Universal Algorithm for Sequential Data Compression,* IEEE TRANSACTIONS ON INFORMATION THEORY, Volume 23, No. 3, at 337–43 (1977). Referring to FIG. 3A, one variation of the LZ-type compression methods provides a dictionary encoder 330 that processes strings of an original message stream 310 by determining whether a current string matches a string previously stored in the dictionary 320. The current string is initially the first symbol of the original message stream 310 not already encoded, and the dictionary 320 is initialized to include an entry for each possible symbol to ensure that an initial string will match at least one dictionary entry. As long as the current string matches a dictionary entry, the dictionary encoder 330 adds the next symbol from the original message stream 310. If the current string does not match a dictionary entry, the dictionary encoder 330 creates a dictionary entry for the current string and encodes the current string using the index of the newly created dictionary entry. In this case the information added to the encoded message stream includes not only the encoded string, but also update information for the newly created dictionary entry. The process continues until the original message stream 310 is completely processed. The encoded message stream 340 thus consists of a series of codes corresponding to the dictionary entries representing strings of the original message stream along with any necessary dictionary update information.

FIG. 3B illustrates a corresponding LZ-type dictionary-based decoding system. The dictionary 350 is updated as new information is received in the encoded message stream 340. Using the dynamically updated dictionary 350, the dictionary decoder 360 processes the dictionary codes in the encoded message stream 340 by retrieving strings corresponding to the dictionary codes from the dictionary 350, thus producing a reconstructed message stream 370.

This example of a dictionary-based compression method is inherently adaptive, as a dictionary is customized for each encoded message. In general, the compression rate achieved by dictionary-based compression methods is proportional to the number of matches found between strings of the message stream and dictionary entries. Because the number of matches tends to increase as more of a new message is processed and more dictionary entries are created, the compression rate achieved tends to be low when processing begins and increases as more of the message is processed. Accordingly, better compression rates tend to be achieved on larger messages.

Data compression methods, such as those described above, enhance the efficiency of systems that manipulate data by, for example, storing or transmitting data. However, these methods can require significant processing and memory resources which make them unsuitable for use in systems such as wireless paging, or other messaging systems in which the receiving devices have limited processing and memory capability and messages tend to be small.

SUMMARY

In general, in one aspect, the invention features a computer-implemented method for encoding an alphanumeric message, by matching strings of at least one symbol in the alphanumeric message with corresponding entries in a predetermined phrase dictionary, in which each dictionary entry corresponds to a phrase code. The method further replaces matched strings in the message with corresponding phrase codes, and encodes at least a portion of the remaining symbols in the message using a statistical model based coding method.

Certain implementations of the invention may include one or more of the following features.

The alphanumeric message encoded is a wireless message.

The dictionary entries include phrases recognized in previously processed messages, and/or phrases recognized in messages stored in a historical message database.

The dictionary entries are ordered in the dictionary based on the frequency of their occurrence in previously processed messages. In some implementations, the dictionary entries may include integers. In general, the dictionary entries may be adapted for specific applications.

For example, in a paging system, the dictionary entries are specifically adapted for the intended users of the paging system.

Matching a string of at least one symbol in the alphanumeric message with a corresponding entry in the dictionary further includes identifying the string, searching the dictionary for the corresponding entry, and determining the corresponding phrase code for the matching entry.

A phrase code corresponding to a dictionary entry may represent a phrase defined by a single word. The single word may include a special character. Alternatively, a phrase code corresponding to a dictionary entry may represent a phrase defined by a single word or an integer, where the integer may include a hyphen, or a phrase defined by one or more words or integers, where each word may include a special character and an integer may include a hyphen.

Encoding at least part of the remaining symbols of the received message further includes determining an efficiency parameter for the encoding of a portion of the remaining symbols and encoding that portion only if the efficiency parameter exceeds a predetermined threshold. The symbols left in non-encoded format may be represented in ASCII format.

The statistical model based coding method for encoding at least a portion of the remaining symbols in the message may be, for example, an arithmetic coding method, a Huffman coding method, or a Shannon-Fano coding method, or a combination thereof. The statistical model based coding method may be an adaptive method.

The method may further include encoding the phrase codes replacing the matched strings and the remaining symbols in the message using a statistical model based coding method.

The method may further include identifying strings representing at least one numeric symbol in the alphanumeric message and encoding those identified numeric strings using a numeric encoding method.

In general, in another aspect, the invention features a memory device storing computer-readable instructions for enabling a data compression system to encode an alphanumeric message using computer-implemented methods such as are described above.

In general, in one aspect, the invention features a data compression system comprising an encoding system including a predetermined dictionary having entries represented by corresponding phrase codes, a phrase encoder for encoding strings of at least one symbol in the alphanumeric message with phrase codes representing dictionary entries corresponding to the strings, and a model encoder for encoding at least a portion of the remaining symbols in the message using a statistical model based coding method.

The encoding system may be embedded in a wireless base station for transmitting the encoded alphanumeric message and the data compression system includes a receiving device for receiving and decoding the encoded message. Such a receiving device may include a predetermined dictionary corresponding to the predetermined dictionary of the encoding system, a phrase decoder for decoding phrase codes in the encoded message with strings corresponding to dictionary entries identified by the phrase codes, and a model decoder for decoding portions in the encoded message encoded using the statistical model based coding method.

Among the advantages of the invention are one or more of the following. The present invention achieves data compression in systems having limited resources, such as processing and data storage resources. Specifically, the invention can be implemented in systems such as paging systems, which have limited resources available at the decoding end of the system. The invention achieves data compression with insignificant delay. The invention achieves significant data compression even for short messages. In paging systems, the invention enables data transmission using decreased bandwidth usage and minimized transmission time without compromising the quality of the transmitted data.

The Phrase Dictionary can be customized for specific applications, including applications for different languages. Customization can increase the likelihood that a phrase in an original message stream has a matching entry, thus achieving increased compression. Customization can also enable a suitable searching method to be used with the Dictionary, and can enable phrases to be efficiently ordered in the Dictionary.

Because corresponding Phrase Codes must be used by the Phrase Dictionaries at the encoding and decoding ends, the invention achieves a degree of encryption as well as compression.

DETAILED DESCRIPTION

The invention may be implemented in special purpose hardware, software applications running on general purpose hardware, or a combination of both. For example, in a wireless communications system, the invention may be implemented using software applications in a computer system and wireless receivers and/or transmitters.

Figure 1A:
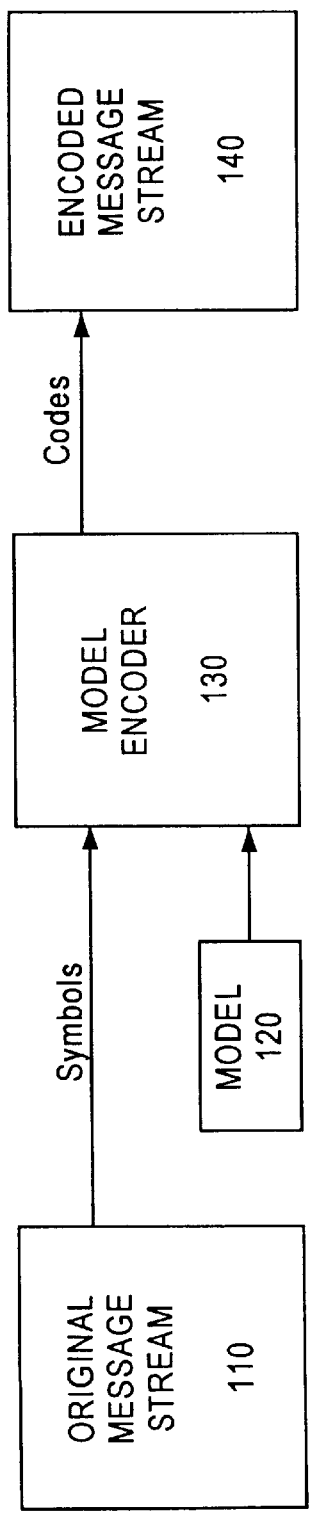
FIGS. 1A and 1B are block diagrams of static statistical model-based data compression systems.
Figure 1B:
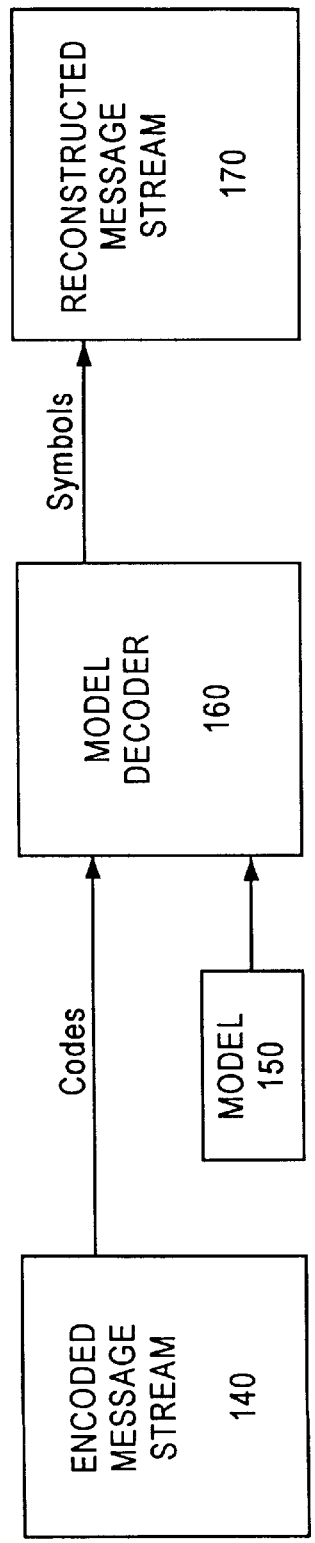
Figure 2A:
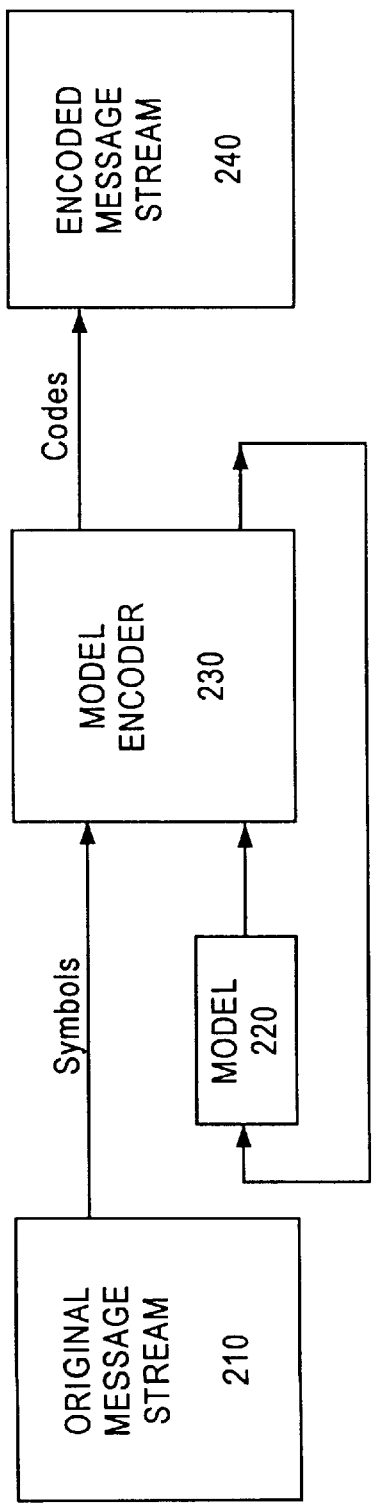
FIGS. 2A–2D are block diagrams of adaptive statistical model-based data compression systems.
Figure 2B:
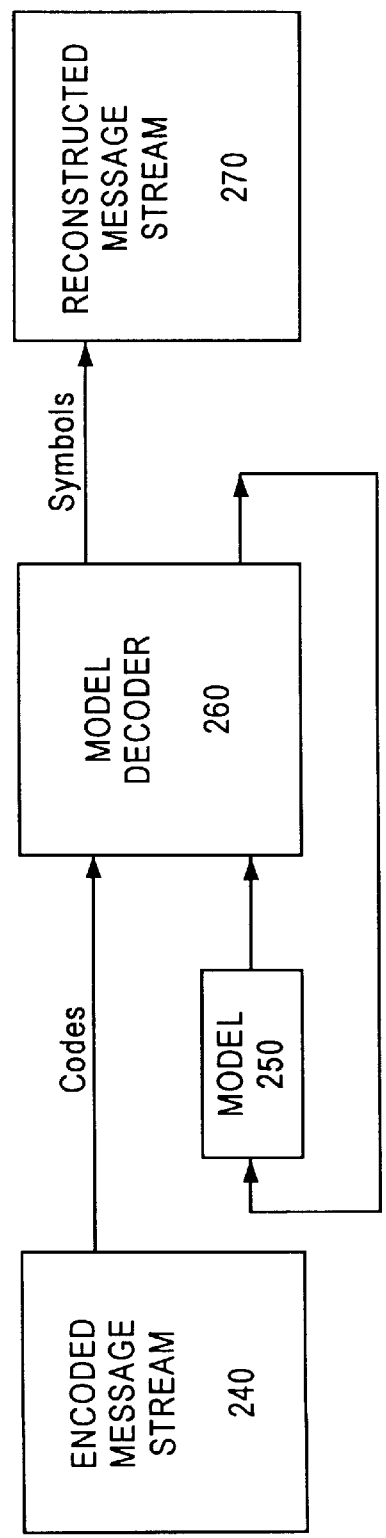
Figure 2C:
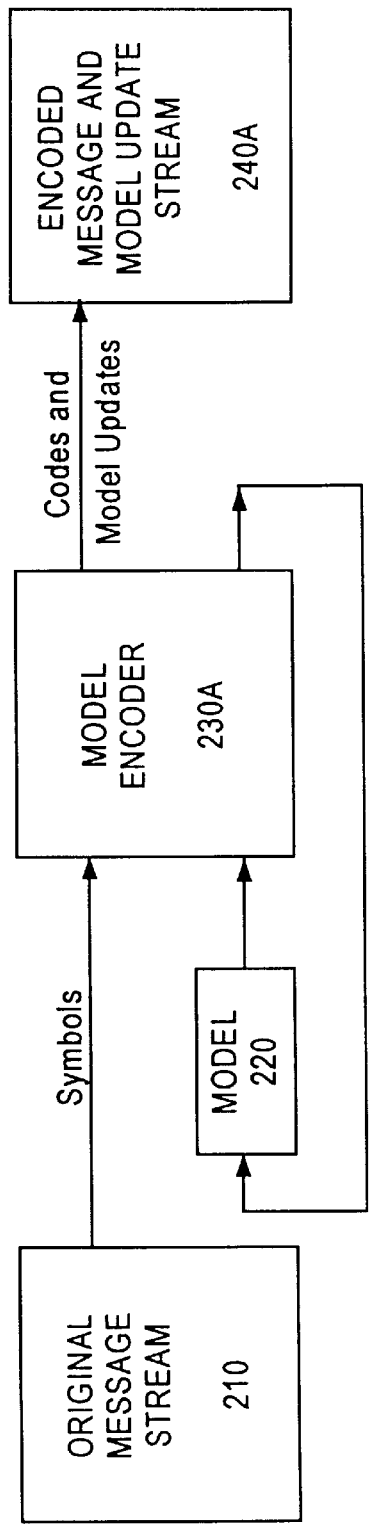
Figure 2D:
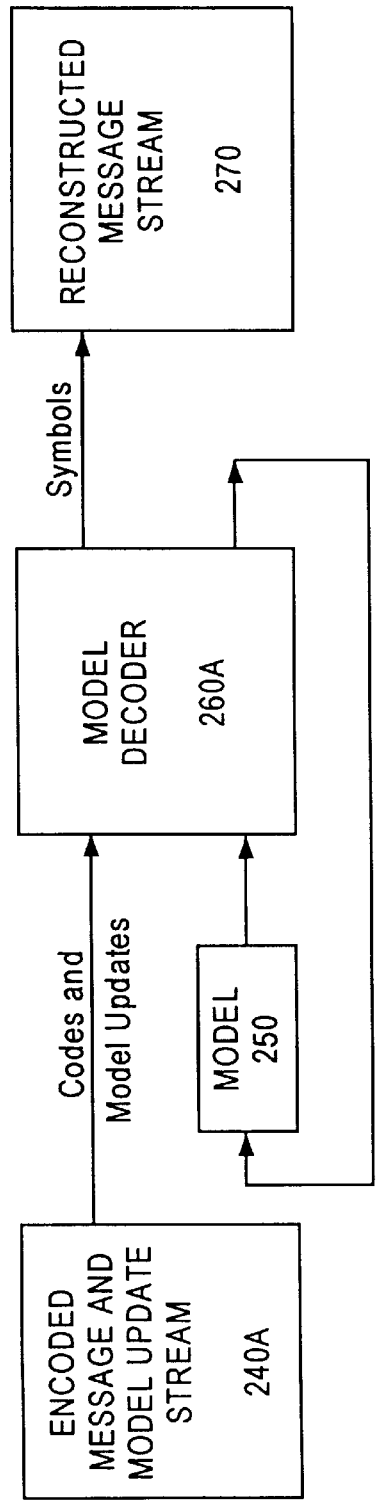
Figure 3A:
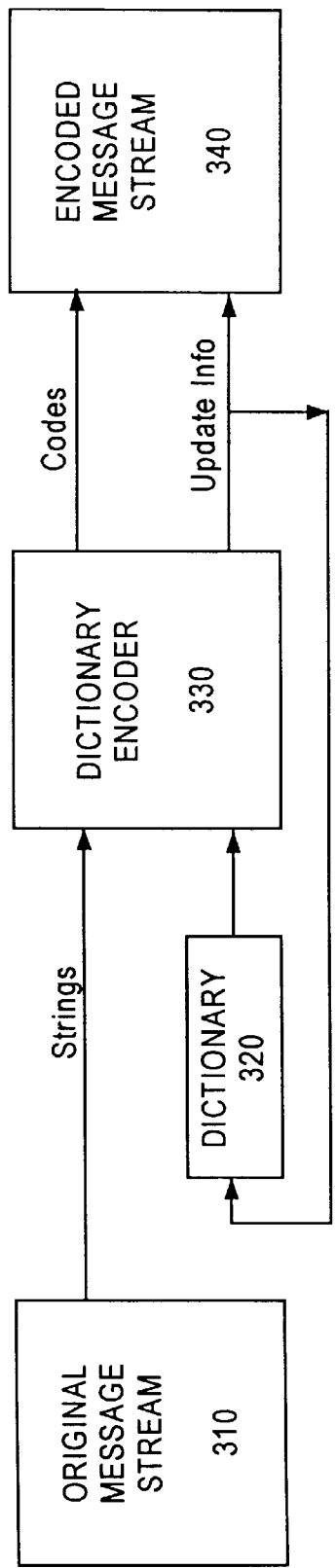
FIGS. 3A and 3B are block diagrams of dictionary-based data compression systems.
Figure 3B:
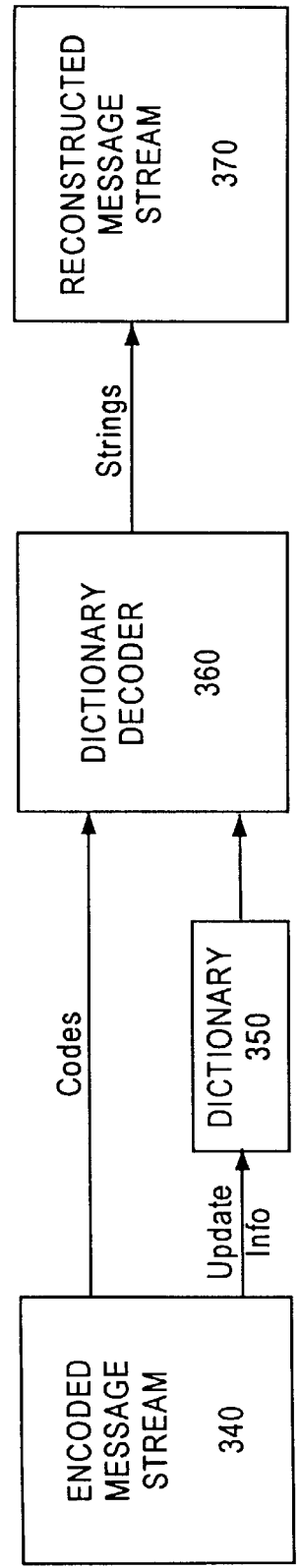
Figure 4:
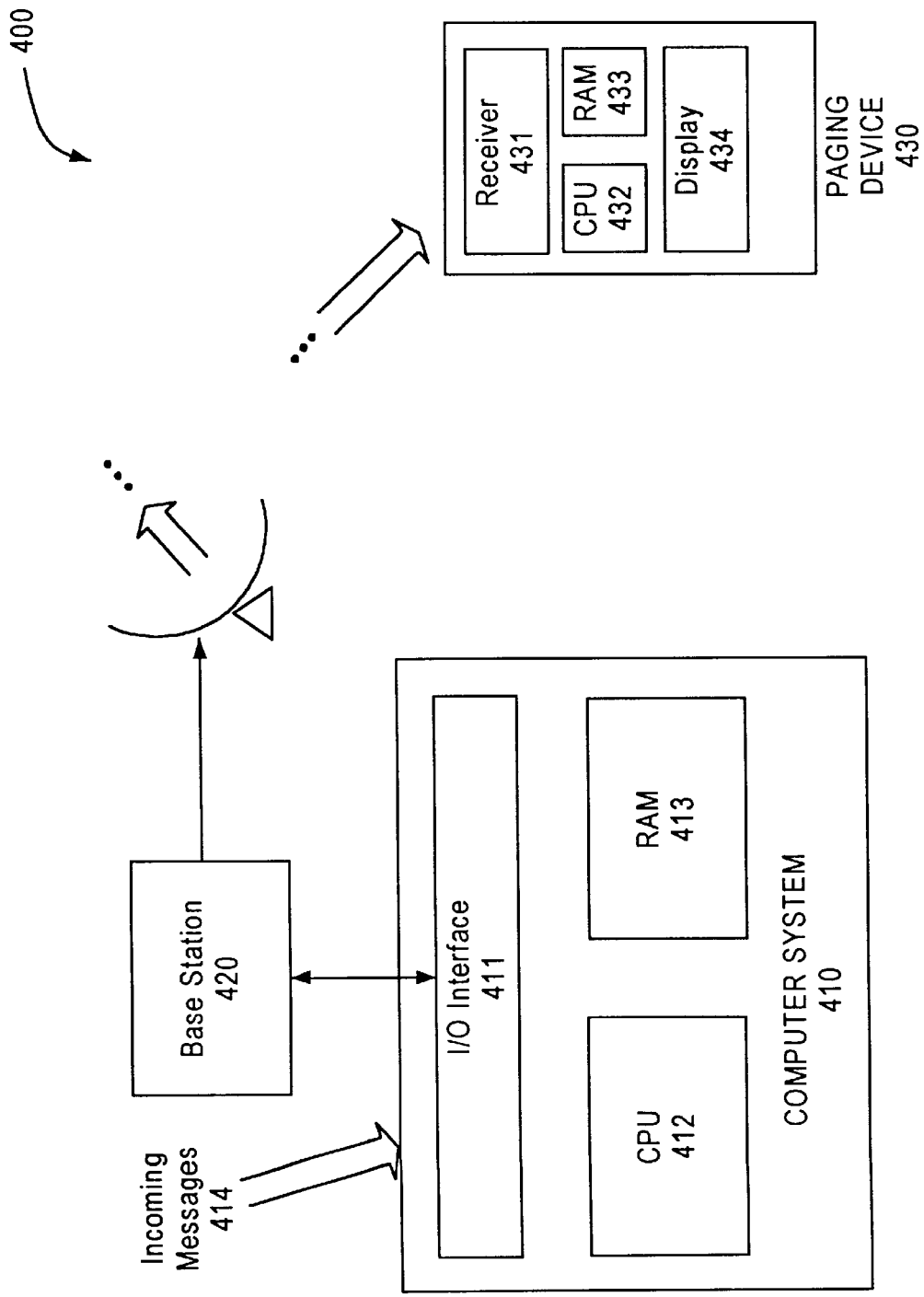
FIG. 4 illustrates a communication system which can utilize data compression techniques.

FIG. 4 shows an illustrative system 400 incorporating the present invention, including a computer system 410 having an I/O interface 411, a CPU 412, and a RAM 413. The computer system 410 acts as a gateway server for communicating messages to user devices such as paging device 430. I/O interface 411 receives incoming messages from a base station 420 or from other sources, such as telephone lines 414. The CPU 412 and RAM 413 process incoming messages, which are transmitted through the I/O interface 411 to the base station 420. Through an antenna 421, the base station 420 transmits outgoing messages to be received by paging devices such as 430, which include a receiver 431 coupled to a CPU 432, a memory 433, and a display 444. User devices such as paging device 430 may be implemented as one-way (as illustrated) or two-way communication devices.

Figure 5:
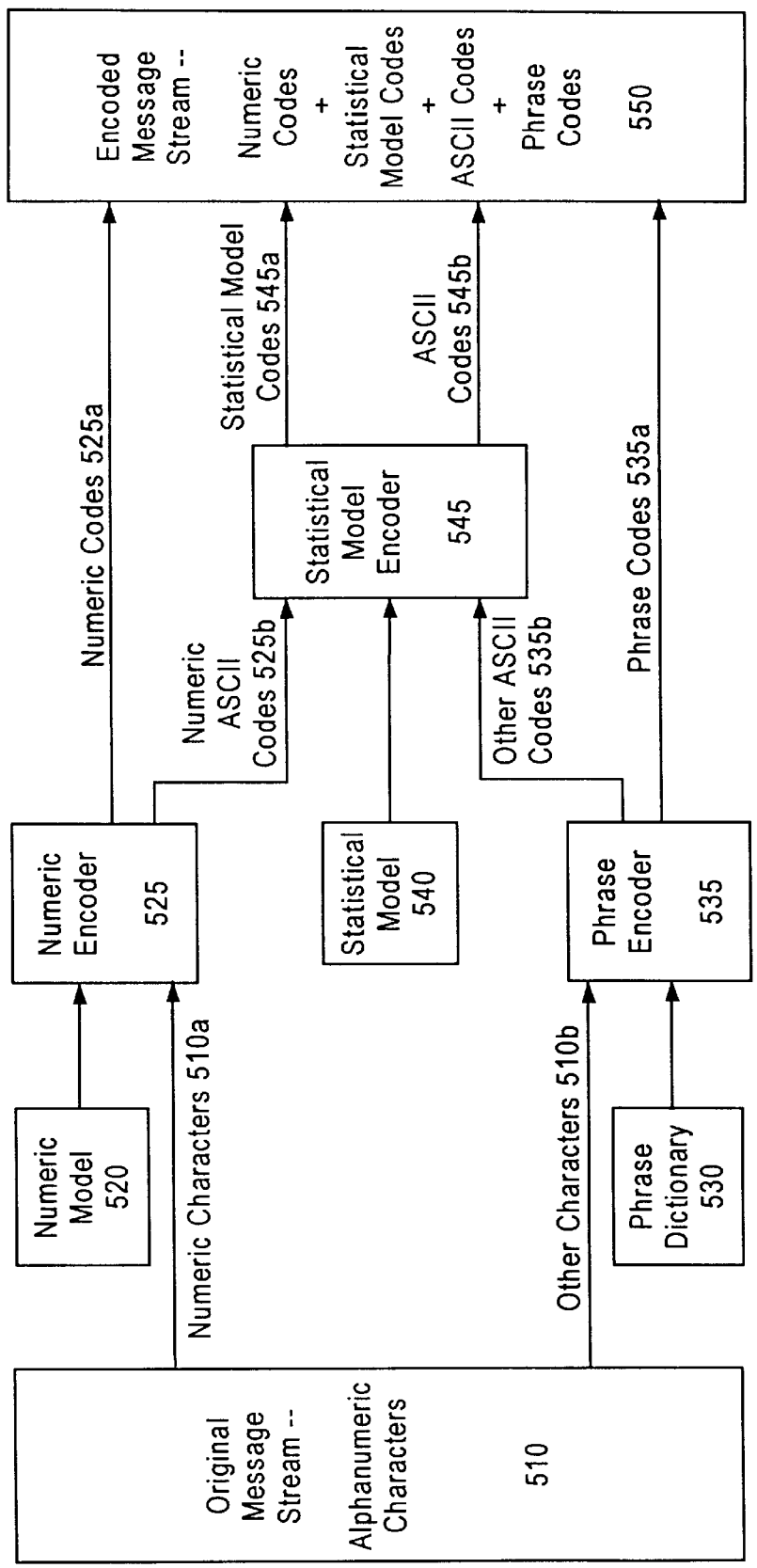
FIG. 5 is a block diagram of an encoding system.

Referring now to FIG. 5, a data compression system encodes a message using a combination of compression techniques. Specifically, in this example, the Original Message Stream 510 of symbols is in ASCII format, which represents symbols as alphanumeric characters, spaces, and punctuation. The data compression system processes the symbols in the Original Message Stream 510 in units of "phrases," which are sequential series of symbols from the Original Message Stream 510 capable of being recognized by the encoders used by the data compression system, in this case, the Numeric Encoder 525, the Phrase Encoder 535, and the Statistical Model Encoder 545.

The definition of a phrase unit may be adapted as appropriate for specific applications and may depend in part on the type of entries in the Numeric Model 520 and the Phrase Dictionary 530, which also may vary. For example, in the context of paging systems, because messages will frequently include phone numbers, the Numeric Encoder 525 and Numeric Model 520 may be designed to recognize and encode, for example, strings of numbers with zero or one embedded hyphen. The Phrase Encoder 535 and Phrase Dictionary 530 may be designed to recognize and encode phrases consisting of single words. In this example, a phrase can therefore be defined as a stream of characters or numbers with zero or one embedded hyphen, followed by a punctuation or a space. Other possible types of phrases include a combination of single words and portions of words, a combination of single and multiple words, single words optionally combined with punctuation, a combination of single and multiple words optionally combined with punctuation, or any of these types, combined with a series of numbers. The optimal entry type will likely vary depending on the intended application of the system.

As will be explained in greater detail with reference to FIG. 6, the data compression system of FIG. 5 includes a Numeric Encoder 525 for encoding phrases comprised of numeric characters (with zero or one embedded hyphen) 510a with Numeric Codes 525a using a predefined Numeric Model 520. Phrases comprised of other than numeric characters (with zero or one embedded hyphen) 510b are processed by a Phrase Encoder 535 using a predetermined Phrase Dictionary 530, which encodes those phrases having matching entries in the Phrase Dictionary 530 with Phrase Codes 535a. Phrases received, but not recognized, by the Numeric Encoder 525 or the Phrase Encoder 535 are left in their original format 525b and 535b (in this example, ASCII format) to be processed by a Statistical Model Encoder 545, which either encodes the symbols with Statistical Model Codes 545a determined using a Statistical Model 540, or leaves the symbols in their original format 545b. The encoded message stream 550 thus consists of a variety of codes, which may include Numeric 525a, Phrase 535a, Statistical Model 545a, and/or ASCII 545b codes.

Figure 6:
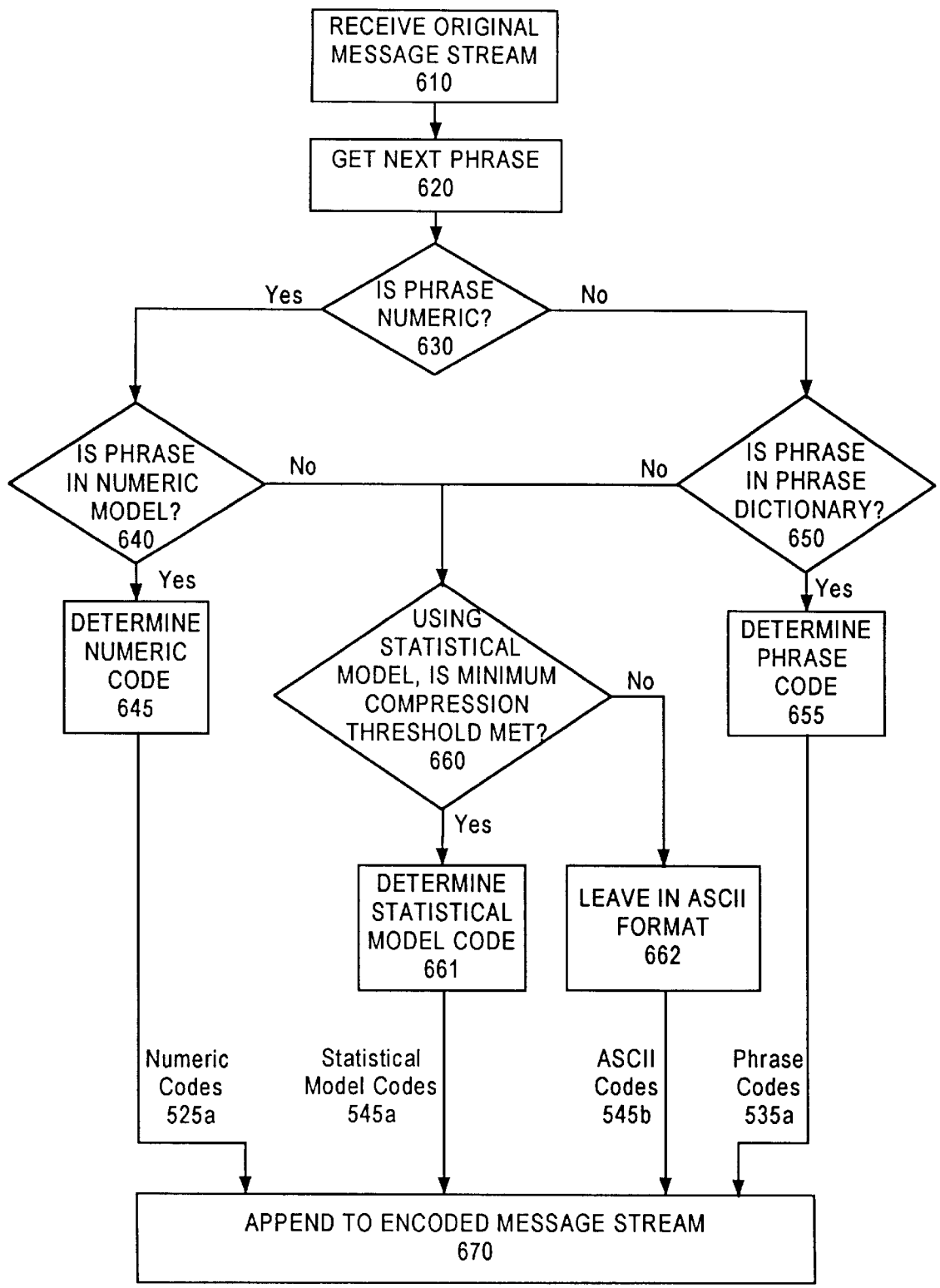
FIG. 6 is a flow chart illustrating an encoding method.

FIG. 6 is a flow chart of the encoding process performed by the data compression system illustrated in FIG. 5. After an Original Message Stream 510 is received (step 610), the system determines a Next Phrase (step 620), defined as the next phrase in the Original Message Stream 510 not already processed.

Returning to FIG. 6, once the next phrase is determined (step 620), the method determines whether the phrase consists of numeric symbols (with zero or one embedded hyphen) (step 630). If it does, the Numeric Encoder 525 determines whether the phrase can be encoded using the Numeric Model 520 (step 640).

In this example, the Numeric Model 520 associates a Numeric Code 525a with any string of numbers having values within a predefined range. In this example, the range is between 1 and 1023 (inclusive). Thus, if the Numeric Encoder 525 determines that the phrase represents a number between 1 and 1023, the Numeric Encoder 525 determines a Numeric Code 525a for the phrase using the Numeric Model 520 (step 645), which is then appended to the Encoded Message Stream 550 (step 670). The Numeric Code 525a is determined such that it indicates whether a hyphen is embedded in the string of numbers.

If the phrase does not consist of numeric symbols (with zero or one embedded hyphen), the Phrase Encoder 535 determines whether the phrase has a matching entry in the Phrase Dictionary 530 (step 650). In this example, the Phrase Dictionary 530 is a table in which each entry represents a unique string of characters and each entry is uniquely identifiable. As mentioned, Dictionary entries may be restricted to specific phrase types, such as single words, and the specific phrases selected for dictionary entries may vary depending on the intended application of the system.

The data compression system may be customized for specific uses. For example, to customize the Phrase Dictionary 530 for a paging system, phrase types may be limited to a combination of single words, including any following punctuation. This takes into account that paging messages are typically short (i.e., having a small number of words). As a further customization, the dictionary entries may be determined based on frequently appearing phrases in a historical database of actual or simulated paging messages, based on the assumption that the historical frequency with which phrases appeared in previous messages provides an accurate indication of the frequency with which they will appear in future messages. Messages in the historical database are decomposed into individual phrases. The frequency of occurrence is calculated for each phrase, and entries in the dictionary are created for the N phrases having the highest frequencies. The phrase code associated with each entry is based on its dictionary index.

Using the predetermined Phrase Dictionary 530 avoids the overhead required to create or update a dictionary to process new messages. This overhead can be prohibitively expensive particularly in systems such as paging systems having paging devices characterized by limited processing and storage resources, and by short messages which generally result in low compression rates using traditional dictionary approaches. In dictionary-based systems, the compression efficiency increases as the number of matches increase, and the number of matches increase as symbol streams are repeatedly recognized in a message. In systems that require the dictionary to be created or adapted for new messages, short messages, which have fewer repeated streams, have correspondingly fewer matches and achieve lower compression efficiency. Because the Phrase Dictionary 530 is predetermined, the overhead for creating and/or adapting a dictionary is largely avoided and efficient compression can be achieved even for short messages.

The number N of dictionary entries may be varied. Although increasing the number of dictionary entries enables more phrases in an original message stream to have corresponding dictionary entries, a larger dictionary will require greater memory resources to store and greater processing resources to search. In this example, the Phrase Dictionary 530 has 14335 entries, each of which can be uniquely identified by a 14-bit code representing its index in the Dictionary 530. This enables a phrase corresponding to any dictionary entry to be represented in a maximum of two bytes, with two bits of the first byte being allocated for identifying the code as a Phrase Code.

Figure 7:
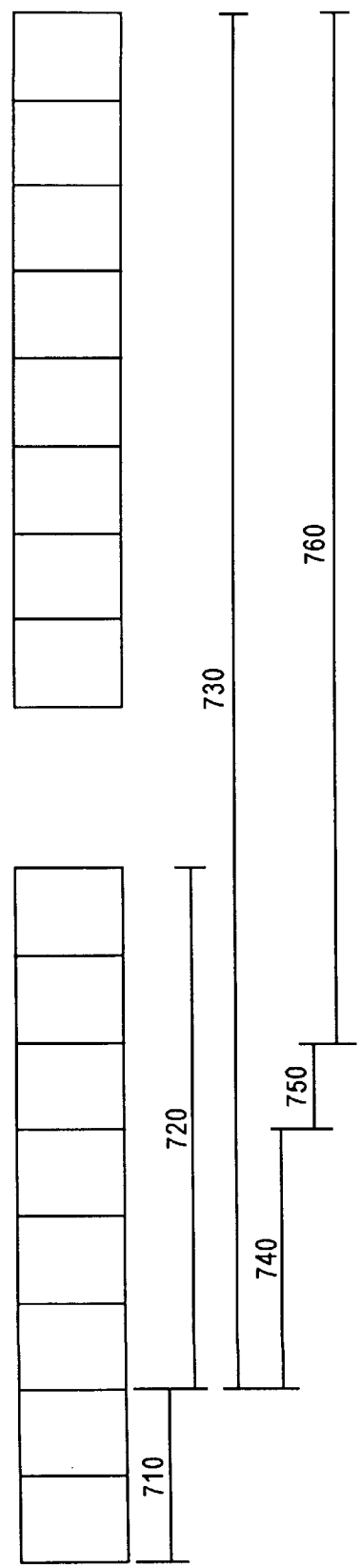
FIG. 7 illustrates the bit allocation used in accordance with a data compression system.

FIG. 7 shows the two bytes used to represent the various types of codes in this embodiment. Specifically, two bits 710 of a first byte are used to indicate that the phrase is encoded using either a one byte Phrase Code Identifier (using the two bits "10") or a two byte Phrase Code Identifier (using the two bits "11"). As explained in greater detail below, the two bits may also identify two other types of codes, in this case, Statistical Model Codes (using the two bits "01"), and ASCII Codes (using the two bits "00").

The first sixty-three entries of the Phrase Dictionary 530 are identified using the one byte Phrase Code Identifier "10" and using the remaining six bits 720 of the first byte to identify the entry's index in the Dictionary 530. The 64$^{th}$ through 14335$^{th}$ Dictionary entries are identified using the two byte Phrase Code Identifier "1" and using the eight bits of the following byte in addition to the remaining six bits of the first byte (the fourteen bits 730) to represent the entry indices.

In this embodiment, the dictionary entries having indices 1–14335, inclusive, represent a phrase consisting of a single word, including any following punctuation, and each of these entries is identified by a Phrase Code Identifier "10" or "11" followed by a binary code representing a number between 1–14335 corresponding to its dictionary index. A Phrase Code Identifier "11" followed by binary numbers 14337–16383 are reserved for use by the Numeric Encoder 525 to represent the numbers 1–1023, including any following hyphen. More specifically, a number in the original message stream between 1 and 1023 is encoded by the Numeric Encoder 525 by assigning Phrase Code Identifier "11" in bit positions 710, followed by bits "111" in bit positions 740, an entry in bit position 750 depending on whether the number is followed by a hyphen (which is common in phone numbers transmitted in paging messages), and the number, in binary form, in the remaining ten bits 760 of the two bytes.

Returning to FIG. 6, if the Phrase Encoder 535 finds a matching entry in the Phrase Dictionary 530 for the current phrase, it determines a Phrase Code 535a (step 655) which is appended to the Encoded Message Stream 550 (step 670). As explained above, the Phrase Code 535a will include a Phrase Code Identifier, followed by the six or fourteen bits required to represent the corresponding entry's index in the Phrase Dictionary 530.

If the Numeric Encoder 525 or the Phrase Encoder 535 is unable to encode the current phrase, the phrase is passed to the Statistical Model Encoder 545 for encoding the symbols of the phrase based on the statistical probabilities of those symbols in a message as provided by the Statistical Model 540.

A variety of statistical model-based methods may be used, including, for example, Arithmetic coding, Huffman coding, and Shannon-Fano coding. Several examples of possible methods are described in references such as MARK NELSON AND JEAN-LOUP GAILLY, THE DATA COMPRESSION BOOK (M&T Books, 2d ed. 1996). In the example of FIGS. 5 and 6, Arithmetic coding is used.

Arithmetic coding is based on a statistical model producing a code for a string of symbols, with the number of bits required to represent the code varying with the specific string. As symbols comprising a string are successively encoded, each encoded symbol incrementally modifies the code for the string. As explained in greater detail in references including Chapter 5 of MARK NELSON AND JEAN-Loup GAILLY, THE DATA COMPRESSION BOOK, each symbol is represented by a real number interval between 0 and 1, and as symbols of a message are encoded, the size of the interval needed to represent a message becomes smaller and the number of bits needed to represent the interval increases. When a string is completely processed, the code includes data indicating the number of bits used to encode the string.

Each symbol's code represents its estimated probability of occurrence, and successive symbols of the message reduce the size of the interval in accordance with their respective probabilities. Symbols with higher probabilities reduce the interval size less than symbols with lower probabilities, and hence add fewer bits to the compressed message.

Because arithmetic coding is generally considered to be relatively expensive with respect to processing and memory resources, a modified arithmetic coding method may be used. For example, referring to FIG. 6, the Statistical Model Encoder 545 may be implemented to encode the string represented by a phrase only if it determines that the string has a probability exceeding a predetermined threshold (for example, 50%) (step 660). Because arithmetic coding has the characteristic that strings with higher probabilities require fewer bits to be encoded, the modified Arithmetic coding ensures that it is applied only when it achieves minimum threshold compression results.

Thus, only if the Statistical Model Encoder 545 determines that the string probability exceeds a predetermined threshold does it encode the string with a Statistical Model Code 545a (step 661) to be appended to the Encoded Message Stream 550 (step 670). As briefly mentioned above with reference to FIG. 7, the code is identified as a Statistical Model Code by setting the two high order bits 710 in accordance with a predetermined type-identification scheme (in this case, "01"). As indicated above, a Statistical Model Code has a variable bit length determined by data embedded in the code.

If the Statistical Model Encoder 545 determines that the string probability does not exceed the predetermined threshold, the string is left in ASCII format 545b (step 662), the two bit identifier 710 is set to identify the code as ASCII code (in this case, "00"), and the code 545b is appended to the Encoded Message Stream 550 (step 670).

Figure 8:
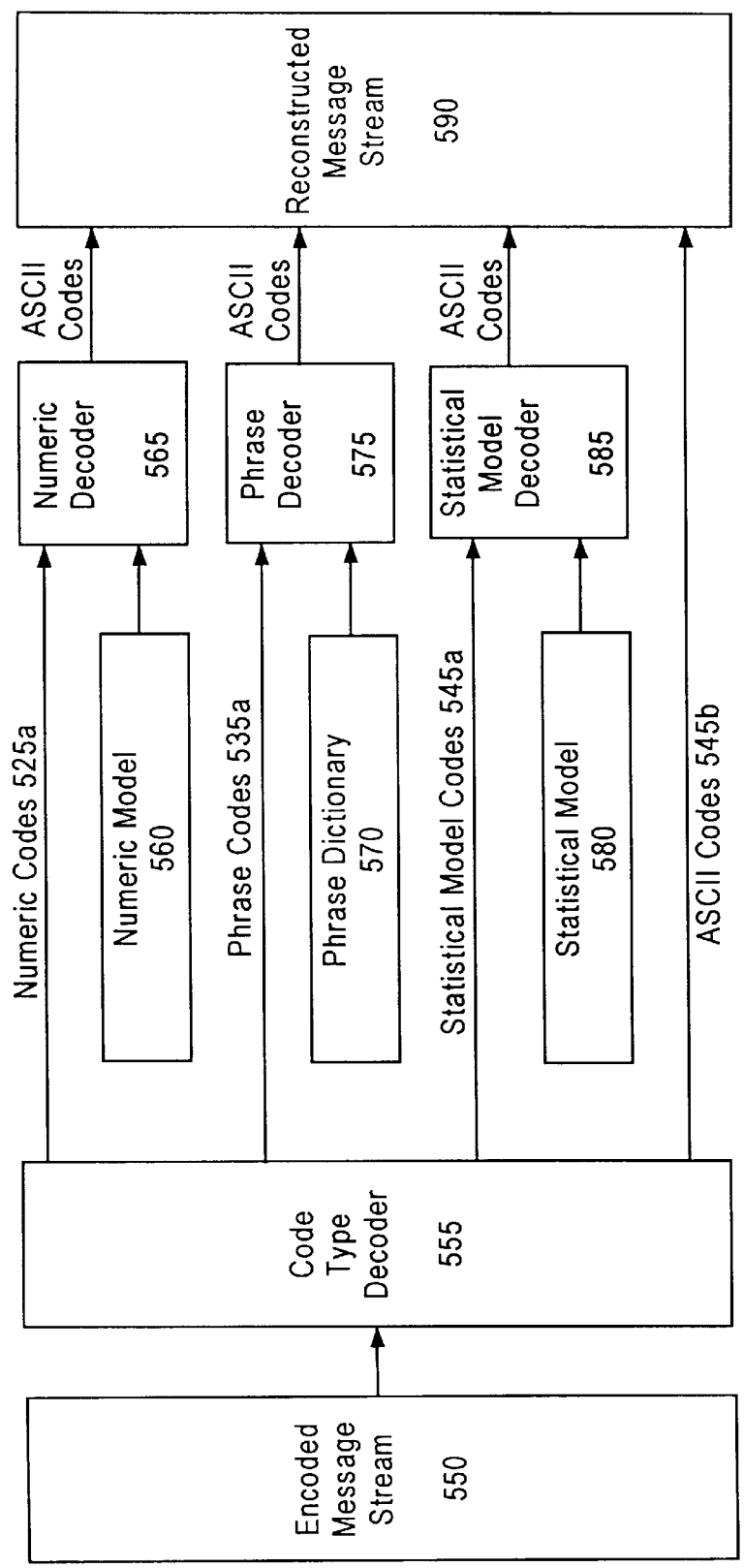
FIG. 8 is a block diagram of a decoding system.
Figure 9:
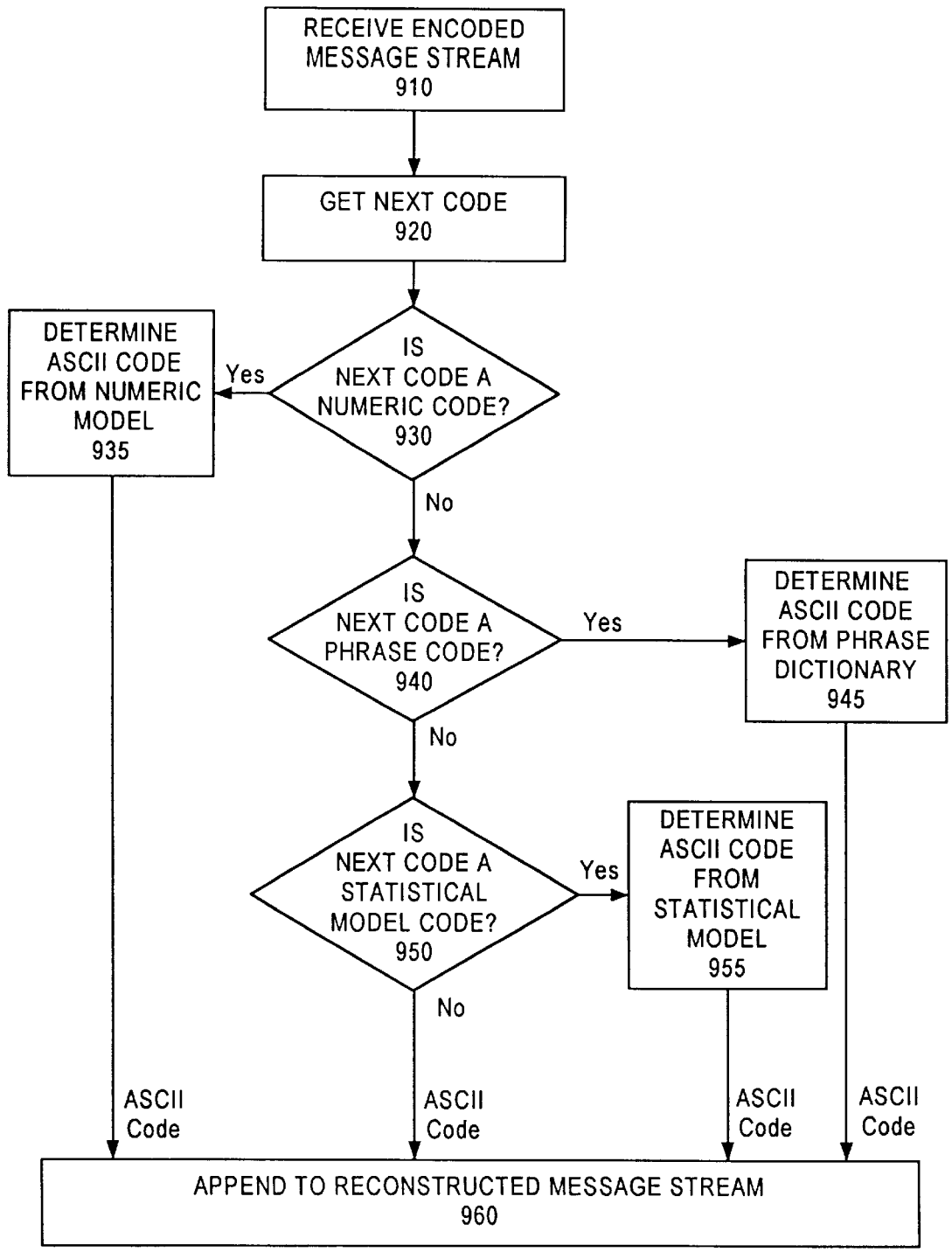
FIG. 9 is a flow chart illustrating a decoding method.

FIG. 8 illustrates a system 800 for creating a Reconstructed Message Stream 590 from the Encoded Message Stream 550, comprising a hybrid string of codes as described above with reference to FIGS. 5 and 6. FIG. 9 is a flow chart for the decoding process. After the Encoded Message Stream 550 is received (step 910), a Code Type Decoder 555 retrieves the next code (step 920) to determine the code type. As explained above, two bits of the first incoming byte are reserved for identifying the type of encoding used to encode each phrase: "10" for one byte Phrase Codes, "11" for two byte Phrase Codes, "01" for Statistical Model Codes, and "00" for ASCII codes.

In the specific embodiment described above with reference to FIGS. 5 and 6, the Code Type Decoder 555 determines that the code is a Numeric Code 525a (step 930) if the first two bits of the code are "11" and the following fourteen bits represent a binary number between 14337 and 16383, inclusive. In this case, the Numeric Decoder 565 uses a Numeric Model 560 corresponding to the Numeric Model 520 used in the Encoder of FIG. 5 to determine the appropriate ASCII Code (step 935), which is then appended to the Reconstructed Message Stream 590 (step 960).

The Code Type Decoder 555 determines that the code is a Phrase Code 535a (step 940) if the first two bits of the code are "10", or if the first two bits of the code are "11" and the following fourteen bits represent a binary number between 1 and 14335, inclusive. In this case, the Phrase Decoder 575 uses a Phrase Dictionary 570 corresponding to the Phrase Dictionary 530 used in the encoding process described with reference to FIGS. 5 and 6. Specifically, the Phrase Decoder 575 uses the Phrase Code 535a to identify a Dictionary index, retrieve the string (in ASCII format) of the entry of the Phrase Dictionary 570 identified by that index (step 945), and append the retrieved ASCII string to the Reconstructed Message Stream 590 (step 960).

If the Code Type Decoder 55 determines that the code is a Statistical Model Code 545a (step 950), the Statistical Model Decoder 585 uses embedded data to determine the number of bits comprising the code. Using a Statistical Model 580 corresponding to the Statistical Model 540 used in the encoding process, the Statistical Model Decoder 585 decodes the Statistical Model Code 545a to its corresponding ASCII Codes (step 955), and appends the ASCII Codes to the Reconstructed Message Stream 590 (step 960).

Finally, if the Code Type Decoder 820 determines that the code is not a Numeric Code 525a, a Phrase Code 535a, nor a Statistical Model Code 545a, the code is assumed to be in ASCII format. Accordingly, the code is simply left as is and added to the Reconstructed Message Stream 590 (step 960).

A decoding system such as has been described with reference to FIGS. 8 and 9 may be implemented in, for example, a paging unit 430 such as that illustrated in FIG. 4, using the CPU 432 and memory 433 to implement the decoding process. As noted above, because the Phrase Dictionary 570 is predetermined, it can be burned into the paging unit (as can the other components 555, 560, 565, 575, 580, and 585).

Other embodiments are within the scope of the claims. For example, the invention may be adapted for a variety of different languages, and symbols of messages may be originally represented by character sets other than ASCII, including EBCDIC, Unicode, and extended character sets such as ISO Latin 1 and Kanji, or a combination of character sets. In such a case, the components of the system, including the Phrase Dictionary, may be customized for more optimally processing the specific symbol types. For example, semantic constraints of languages using the specific character set may be taken into consideration when determining the phrase type and Dictionary entries.

The invention may be implemented to transmit messages to user devices that may be one-way (receiving capabilities only) or two-way (receiving and transmitting capabilities).

The Phrase Dictionary may be periodically updated. For example, if a historical database is continually updated as messages are processed, the frequency with which strings occur can be tracked. If significant changes are detected, the Phrase Dictionary can be updated to reflect these changes, or in systems having sufficient processing and memory resources, the Phrase Dictionary may be adaptively updated for each string processed. In the context of paging systems, this may require the paging units to store the Phrase Dictionary in an erasable memory such as RAM rather than burned-in memory, so that a paging unit can be sent instructions for updating its current dictionary as needed.

The Dictionary entries may be customized for its intended use. For example, the entries may be customized based on the region, industry, or company in which it will be used.

As discussed above, the Dictionary entries may be limited to specified types of phrases. In addition to limitations based on, for example, the number of words allowed in an entry, limitations can be based on the number of bytes in the original string, or the frequency with which a string is likely to occur in messages. In the Phrase Dictionary described above, each Phrase Code of the dictionary is assigned a fixed number of bits (specifically, two bytes), which allows simple and fast retrieval at the decoding end. However, variable sizes for entries of a dictionary are also possible and may be desirable for some applications.

The Phrase Dictionary may be static or adaptive. For example, if resources allow, the Phrase Dictionary may be adapted to update the entries periodically. Alternatively, the data compression system can be implemented to monitor the appearance of phrases in processed messages and to update the Phrase Dictionary periodically. For example, the differences between the frequencies of occurrence assigned to phrases in the Phrase Dictionary and the frequencies monitored in processed messages reach a predetermined threshold, the data compression system may be implemented to update the Dictionary.

Various methods may be used to search the Dictionary to determine whether a matching entry exists for a given Phrase. For example, standard linear or hashing techniques may be used.

Similarly, various methods may be used to order the phrases in the Phrase Dictionary. For example, in the embodiment described above, the phrases may be ordered by their frequency. Used in conjunction with a linear search method, ordering by frequency should result in the most common phrases being recognized most quickly.

A variety of Statistical Model-based methods may be used, including Arithmetic coding, Huffman coding, and Shannon-Fano coding. If resources allow, the original message stream may be entirely encoded using Dictionary and Statistical Model based codes, without leaving any of the original symbols to be represented in ASCII. Similarly, if resources allow, an adaptive model may be implemented rather than a static model.

Variations and alternative methods may be used by the Numeric Encoder and Decoder to encode and decode numbers, as an alternative to the table-based method described above. For example, while the implementation described above encodes numbers within the range of 1 and 1023 (including zero or one hyphens), the range may be varied as desired or as is most appropriate for specific applications. Additionally, other encoding/decoding methods may be used instead of the table-based methods described above. For example, numeric phrases can simply be converted from its original representation to an unsigned integer representation.

While the invention was described in an implementation using Numeric, Phrase, Statistical Model, and ASCII codes, the invention may be implemented to use a variety of different types of codes and/or combinations of codes.

Figure 10:
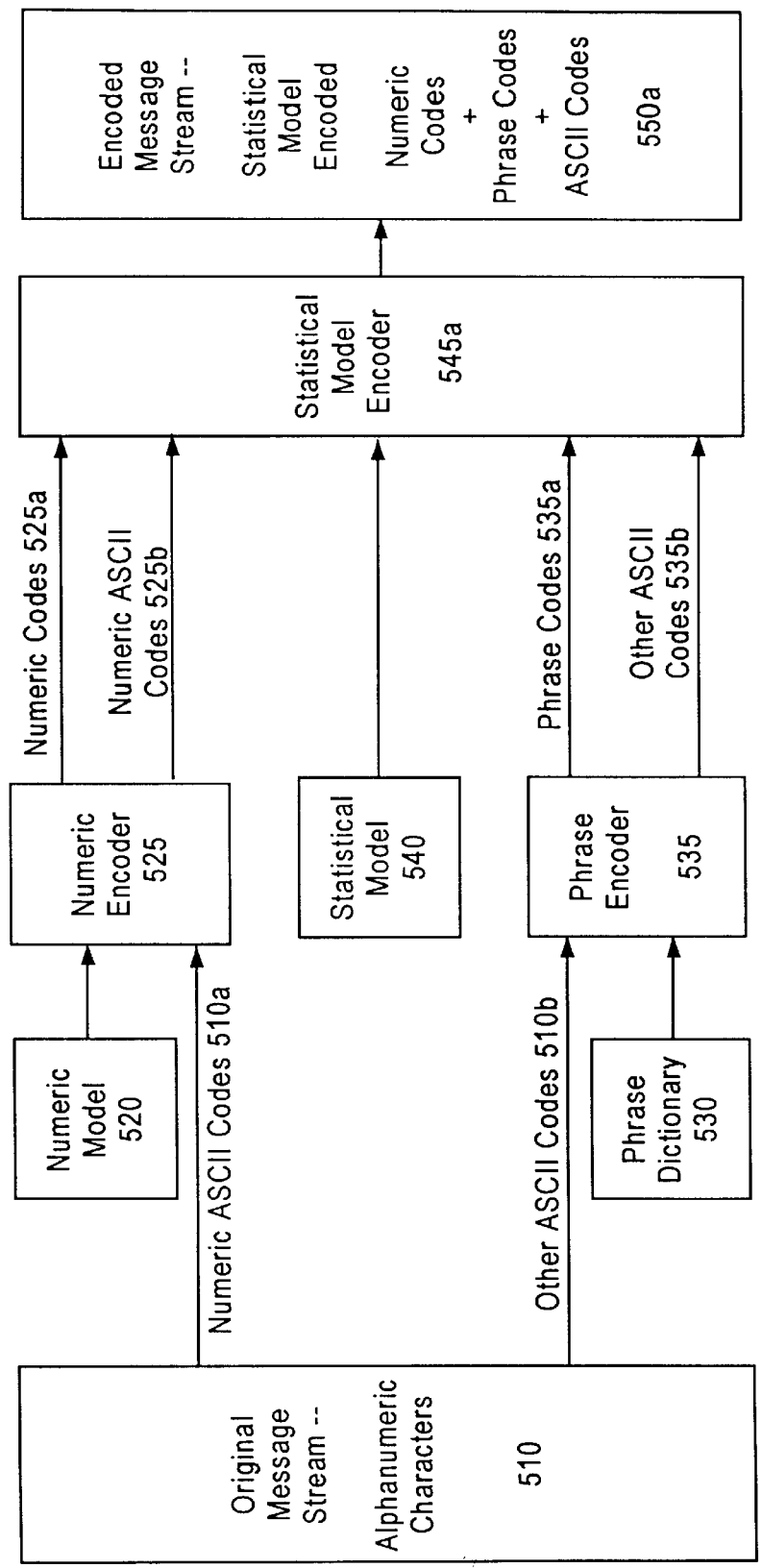
FIG. 10 is a block diagram of an encoding system.

The combination of data compression techniques may be varied. The example described with reference to FIGS. 5 and 6 encodes recognized phrases using a Numeric Encoder 525, Phrase Encoder 535, and a Statistical Model Encoder 545. The Statistical Model Encoder 545 is used only for symbols of non-recognized phrases and only after determining that the model-based encoding meets a predetermined efficiency threshold. Numerous variations are possible. For example, FIG. 10 illustrates an alternative to the encoding system illustrated in FIG. 5 in which the output codes of the Numeric Encoder 525 and the Phrase Encoder 535, which may include Numeric Codes 525a Phrase Codes 535a or ASCII Codes 525b and 535b, are always encoded using Statistical Model Encoder 545a. Using this method, the Encoded Message Stream 550a consists entirely of Statistical Model Encoded codes.

Figure 11:
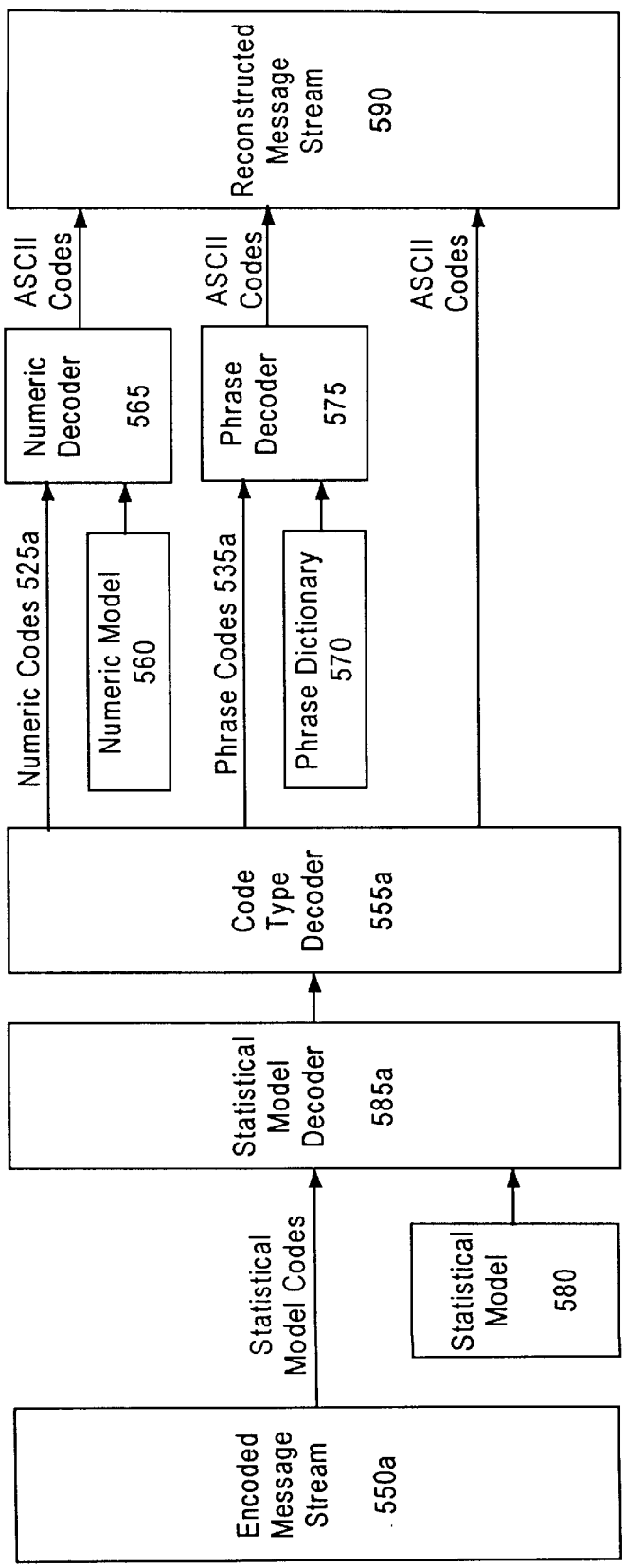
FIG. 11 is a block diagram of a decoding system.

FIG. 11 illustrates a corresponding alternative to the decoding system illustrated in FIG. 8. Because the received Encoded Message Stream 550a consists entirely of Statistical Model Codes, the decoding system first uses Statistical Model Decoder 585a and Statistical Model 580 to decode received codes into Numeric Codes 525a, Phrase Codes 535a and ASCII Codes. The Code Type Decoder 555a then determines the code type to determine whether the code should be processed using the Numeric Decoder 565, the Phrase Decoder 575, or should be simply appended as is to the Reconstructed Message Stream 590.

In another variation, numeric coding and phrase coding can be provided by a single component rather than being processed using separate Numeric and Phrase Encoder/Decoders, as shown in FIGS. 5 and 6, and 10 and 11. Specifically, in the example of FIG. 12, the Original Message Stream 1210 is processed using a single Phrase Encoder 1225 which encodes recognized phrases in the Original Message Stream 1210 having matching entries in the predetermined Phrase Dictionary 1220 with Phrase Codes 1225a. Those not recognized are left in ASCII format 1225b. Whereas in the previously described embodiments, dictionary entries having indices between 14337 and 16383, inclusive, were reserved so that those numbers could be used by the Numeric Encoder 525, in this variation, numbers are represented as entries in the Phrase Dictionary 1220 (for example, entries identified by indices 14337–16383) and are encoded by the Phrase Encoder 1225 rather than the Numeric Encoder 525 of FIGS. 5 and 10.

Figure 12:
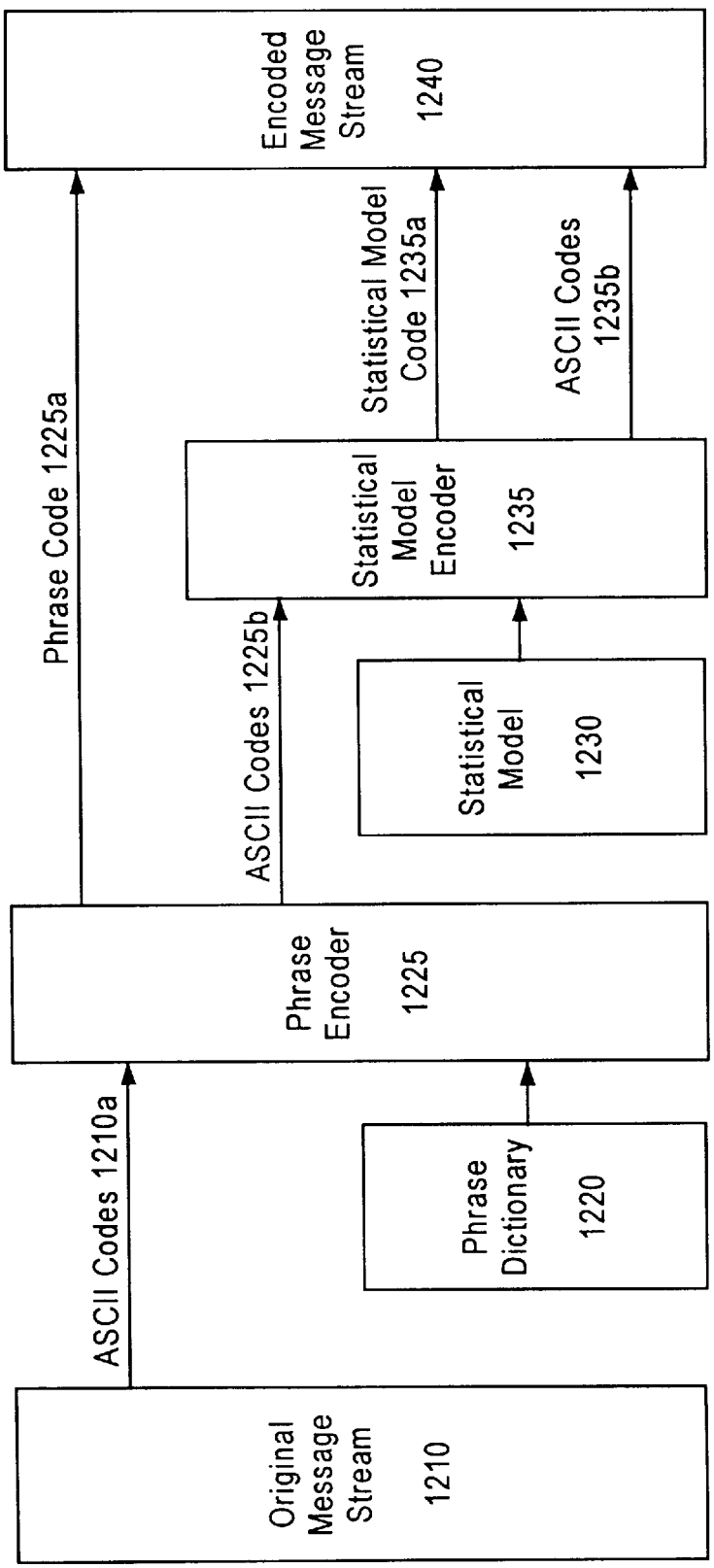
FIG. 12 is a block diagram of an encoding system.

Of course, for applications in which messages are unlikely to include numbers, the variation shown in FIG. 12 could be used without allocating any dictionary entries to represent numbers.

The present invention may be used in conjunction with existing error detection and/or correction schemes.

What is claimed is:

1. A computer-implemented method for encoding an alphanumeric message, comprising:

determining whether a phrase comprising a string of one or more symbols in the alphanumeric message is a numeric phrase, and if so, encoding the phrase in a compressed form according to a predefined numeric model;

when the phrase is not a numeric phrase, matching strings of at least one symbol in the alphanumeric message with corresponding entries in a predetermined phrase dictionary, wherein each dictionary entry corresponds to a phrase code and replacing matched strings in the alphanumeric message with corresponding phrase codes to result in creating a compressed encoding of the phrase; and encoding at least a portion of the remaining symbols in the alphanumeric message using a statistical model based coding method.

2. The method of claim 1, wherein the alphanumeric message is a wireless message.

3. The method of claim 1, wherein the dictionary entries include phrases recognized in previously processed messages.

4. The method of claim 1, wherein the dictionary entries include phrases recognized in messages stored in a historical message database.

5. The method of claim 1, wherein the dictionary entries are ordered in the dictionary based on the frequency of their occurrence in actual and simulated messages.

6. The method of claim 1, wherein dictionary entries include integers.

7. The method of claim 1, wherein the encoding is used in a paging system and the dictionary entries are specifically adapted to include phrase codes for alphanumeric phrases particularly useful to users of the paging system.

8. The method of claim 1, wherein matching a string of at least one symbol in the alphanumeric message with a corresponding entry in the dictionary comprises:

identifying the string;

searching the dictionary for the corresponding entry; and determining the corresponding phrase code for the matching entry.

9. The method of claim 1, wherein a phrase code corresponding to a dictionary entry represents a single word and the single word may include a special character.

10. The method of claim 1, wherein a phrase code corresponding to a dictionary entry represents a single word or an integer string of the type used to represent a telephone number, wherein the integer string may include a hyphen.

11. The method of claim 1, wherein a phrase code corresponding to a dictionary entry represents one or more words or integers, wherein each word may include a special character and an integer may include a hyphen.

12. The method of claim 1, wherein encoding at least a portion of the remaining symbols in the message comprises:

determining an efficiency parameter for the encoding of a portion of the remaining symbols; and encoding that portion only if the efficiency parameter exceeds a predetermined threshold.

13. The method of claim 12, wherein non-encoded symbols are represented in ASCII format when the efficiency parameter does not exceed the pre-determined threshold.

14. The method of claim 1, wherein the statistical model based coding method for encoding at least a portion of the remaining symbols in the message is any of an arithmetic coding method, a Huffman coding method, and a Shannon-Fano coding method.

15. The method of claim 1, wherein the statistical model based coding method for encoding at least a portion of the remaining symbols in the message is an adaptive method.

16. The method of claim 1, further comprising encoding the phrase codes replacing the matched strings and the remaining symbols in the message using a statistical model based coding method if the matching step fails to result in matching strings of at least one symbol in the alphanumeric message with corresponding entries in the predetermined phrase dictionary.

17. A data compression system including an encoding system for compressing an alphanumeric message, the encoding system comprising:

means for determining whether a phrase comprising a string of one or more symbols in the alphanumeric message is a numeric phrase, and if so, encoding the phrase in a compressed form according to a predefined numeric model;

a predetermined dictionary having entries represented by corresponding phrase codes;

a phrase encoder for encoding strings of at least one symbol in the alphanumeric message with phrase codes representing dictionary entries corresponding to the strings, when the phrase is not a numeric phrase, to result in creating a compressed encoding of the phrase; and a model encoder for encoding at least a portion of the remaining symbols in the message using a statistical model based coding method.

18. The data compression system of claim 17, wherein the encoding system further comprises a transmitter for transmitting the encoded alphanumeric message and the data compression system further includes a receiving device for receiving and decoding the encoded message, the receiving device comprising:

a predetermined dictionary corresponding to the predetermined dictionary of the encoding system;

a phrase decoder for decoding phrase codes in the encoded message with strings corresponding to dictionary entries identified by the phrase codes;

a numeric phrase decoder for decoding phrase codes in the encoded message into corresponding numeric strings; and a model decoder for decoding portions in the encoded message encoded using the statistical model based coding method.

19. A memory device storing computer-readable instructions for enabling a data compression system to encode an alphanumeric message, comprising:

instructions for determining whether a phrase comprising a string of one or more symbols in the alphanumeric message is a numeric phrase, and if so, encoding the phrase in a compressed form according to a predefined numeric model;

instructions for matching strings of at least one symbol in the alphanumeric message with corresponding entries in a predetermined dictionary, wherein each entry in the dictionary is represented by a phrase code;

instructions for replacing matched strings in the message with corresponding phrase codes; and instructions for encoding at least a portion of the remaining symbols in the message using a statistical model based coding method.

20. A computer-implemented method for encoding an alphanumeric message, comprising the steps of:

determining whether a phrase comprising a string of one or more symbols in the alphanumeric message is a numeric phrase, and if so, encoding the phrase in a compressed form according to a predefined numeric model;

matching strings of at least one symbol in the alphanumeric message with corresponding entries in a predetermined phrase dictionary, wherein each dictionary entry corresponds to a phrase code;

replacing matched strings in the alphanumeric message with corresponding phrase codes; and if the matching step fails to result in matching the strings of at least one symbol in the alphanumeric message with corresponding entries in the predetermined phrase dictionary, then encoding at least a portion of the remaining symbols in the alphanumeric message using a statistical model based coding method.

21. A wireless paging device configured to receive and decode an encoded message that includes at least a portion encoded according to a numeric model, according to a phrase dictionary, or according to a statistical model, comprising:

a predetermined dictionary corresponding to a predetermined dictionary of an encoding system;

a phrase decoder for decoding phrase codes in the encoded message with strings corresponding to dictionary entries identified by the phrase codes;

a numeric phrase decoder for decoding phrase codes in the encoded message into corresponding numeric strings; and a model decoder for decoding portions in the encoded message encoded using a statistical model based coding method.

\* \* \* \* \*